(12) United States Patent
Choi

(10) Patent No.: US 12,414,370 B2
(45) Date of Patent: Sep. 9, 2025

(54) DISPLAY APPARATUS USING SEMICONDUCTOR LIGHT-EMITTING DEVICES

(71) Applicant: LG ELECTRONICS INC., Seoul (KR)

(72) Inventor: Juchan Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 100 days.

(21) Appl. No.: 17/436,262

(22) PCT Filed: Dec. 4, 2019

(86) PCT No.: PCT/KR2019/016978
§ 371 (c)(1),
(2) Date: Sep. 3, 2021

(87) PCT Pub. No.: WO2020/179989
PCT Pub. Date: Sep. 10, 2020

(65) Prior Publication Data
US 2022/0165756 A1 May 26, 2022

(30) Foreign Application Priority Data
Mar. 4, 2019 (KR) .................... 10-2019-0024916

(51) Int. Cl.
*H10D 86/60* (2025.01)
*H01L 23/00* (2006.01)
(Continued)

(52) U.S. Cl.
CPC .......... *H10D 86/60* (2025.01); *H01L 25/167* (2013.01); *H10D 86/441* (2025.01); *H01L 24/24* (2013.01);
(Continued)

(58) Field of Classification Search
CPC ..... H01L 27/124; H01L 25/167; H01L 33/62; H01L 27/156; H01L 27/1214; H01L 29/786; H01L 33/42
See application file for complete search history.

(56) References Cited

U.S. PATENT DOCUMENTS 6,536,106 B1 3/2003 Jackson et al.
10,672,946 B2 6/2020 Cho et al.
(Continued)

FOREIGN PATENT DOCUMENTS

CN 102822884 A 12/2012
CN 103840073 A 6/2014
(Continued)

*Primary Examiner* — Yara B Green
*Assistant Examiner* — Fakeha Sehar
(74) *Attorney, Agent, or Firm* — Birch, Stewart, Kolasch & Birch, LLP

(57) ABSTRACT

Discussed is a display device including: a substrate; a power wiring and a ground wiring disposed on the substrate and spaced apart from each other; a driving thin film transistor (TFT) disposed on the substrate and having a source terminal electrically connected to the ground wiring; at least one insulating layer disposed on the substrate; and a pair of assembly electrodes spaced apart from each other between the at least one insulating layer and the substrate, wherein the pair of assembly electrodes is configured to generate an electric field as a voltage is applied to any one of the pair of assembly electrodes.

22 Claims, 12 Drawing Sheets

(51) Int. Cl.
*H01L 25/16* (2023.01)
*H10D 86/40* (2025.01)

(52) U.S. Cl.
CPC .... *H01L 24/95* (2013.01); *H01L 2224/24147* (2013.01); *H01L 2224/245* (2013.01); *H01L 2224/95101* (2013.01); *H01L 2224/95136* (2013.01); *H01L 2224/95144* (2013.01); *H01L 2224/95145* (2013.01)

(56) References Cited

U.S. PATENT DOCUMENTS

| | | | |
|---|---|---|---|
| 11,574,954 B2 * | 2/2023 | Im | H01L 33/0095 |
| 2013/0001546 A1 | 1/2013 | Kamada et al. | |
| 2013/0168708 A1 | 7/2013 | Shibata et al. | |
| 2016/0372497 A1 | 12/2016 | Lee et al. | |
| 2017/0104009 A1 * | 4/2017 | Peng | H01L 29/458 |
| 2018/0012876 A1 | 1/2018 | Kim et al. | |
| 2018/0019389 A1 | 1/2018 | Cho et al. | |
| 2018/0175268 A1 | 6/2018 | Moon et al. | |
| 2020/0295223 A1 * | 9/2020 | Cho | H01L 33/32 |
| 2021/0288218 A1 * | 9/2021 | Ko | G09G 3/3426 |

FOREIGN PATENT DOCUMENTS

| | | |
|---|---|---|
| CN | 105900209 A | 8/2016 |
| EP | 3 270 413 A1 | 1/2018 |
| JP | 2000-348860 A | 12/2000 |
| KR | 10-2013-0033450 A | 4/2013 |
| KR | 10-2018-0007025 A | 1/2018 |
| KR | 10-2018-0007376 A | 1/2018 |
| KR | 10-2018-0081378 A | 7/2018 |

* cited by examiner

[FIG.1]
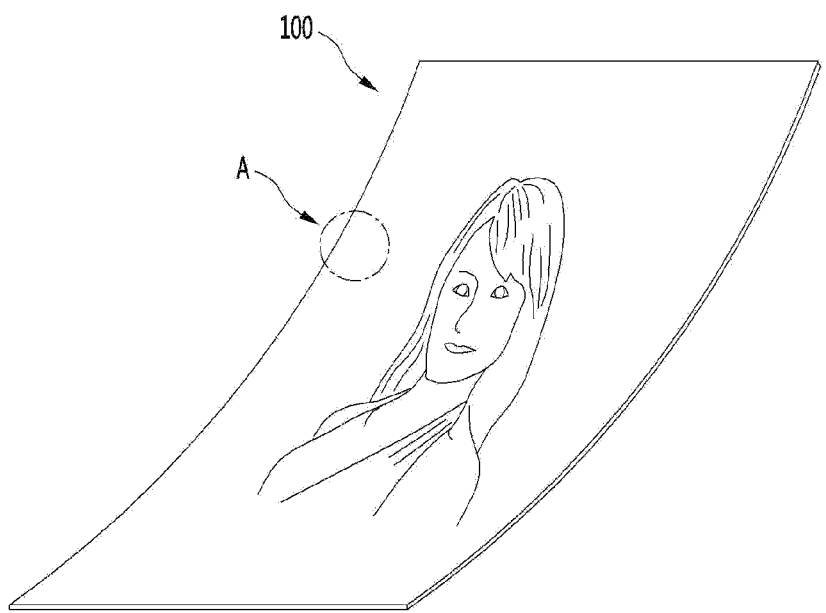
[FIG.2]
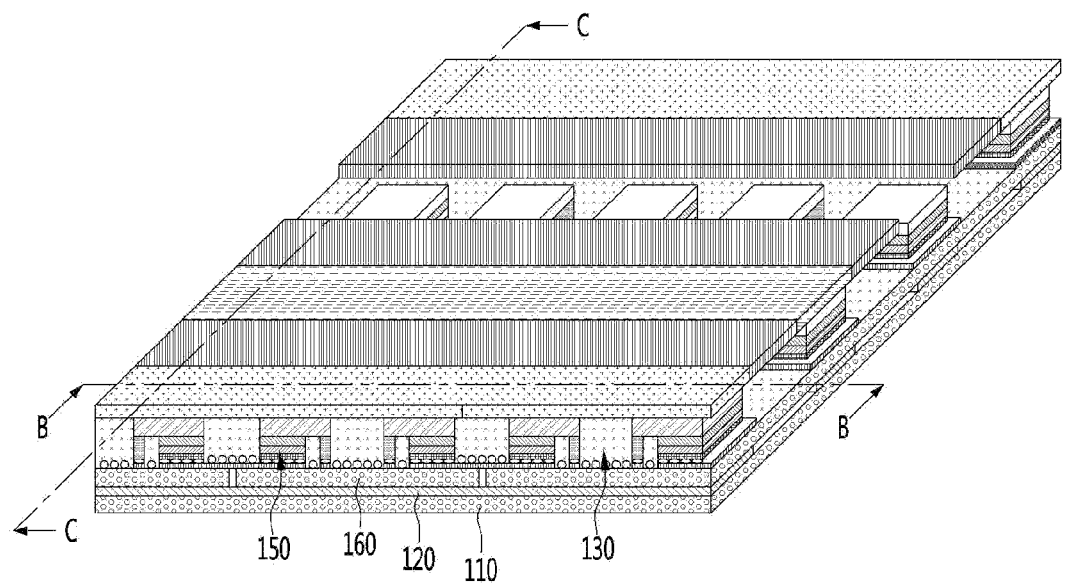

[FIG.3A]
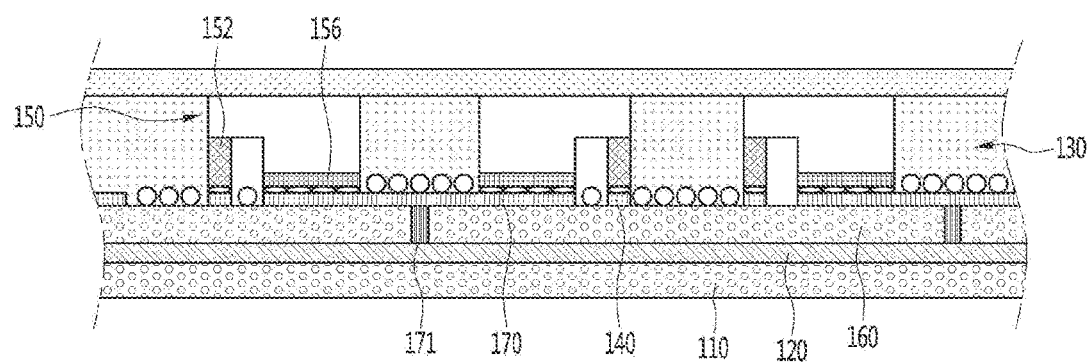
[FIG.3B]
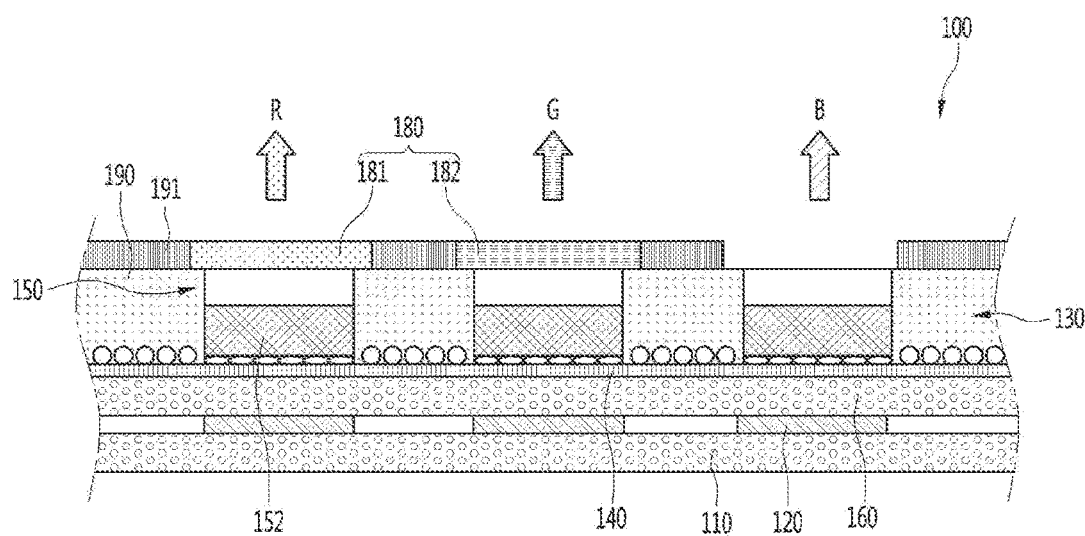

[FIG.4]
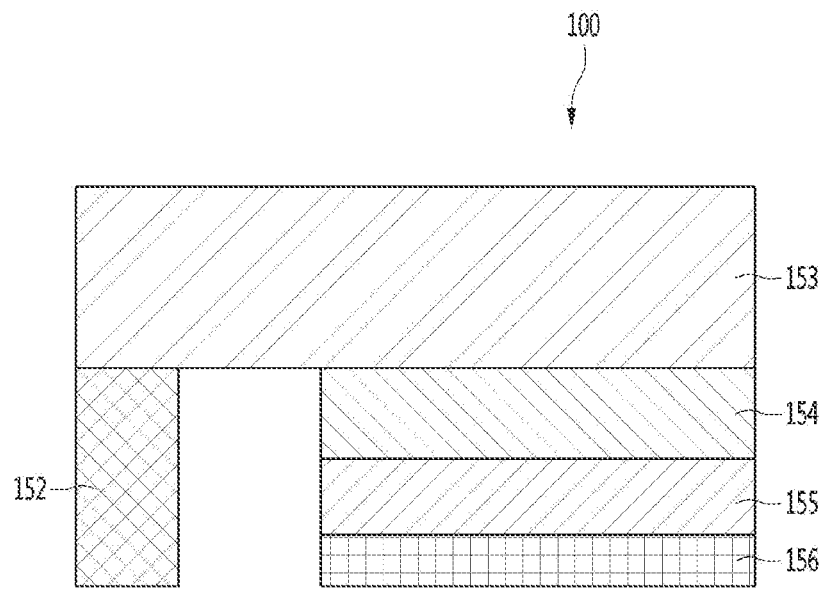
[FIG.5A]
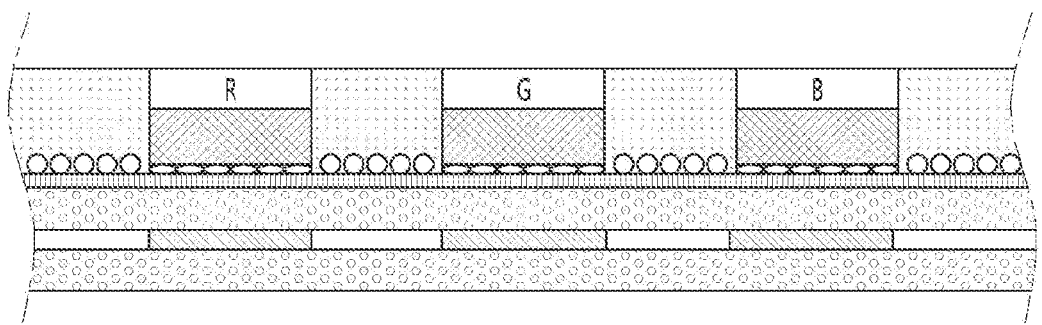

[FIG.5B]
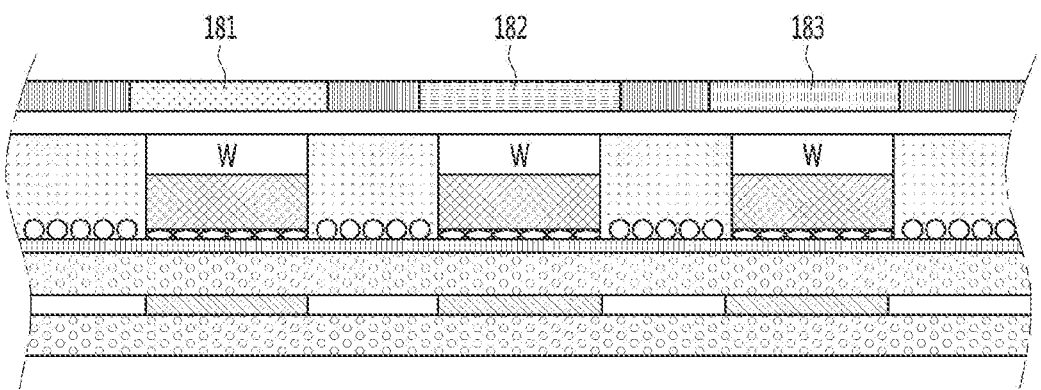
[FIG.5C]
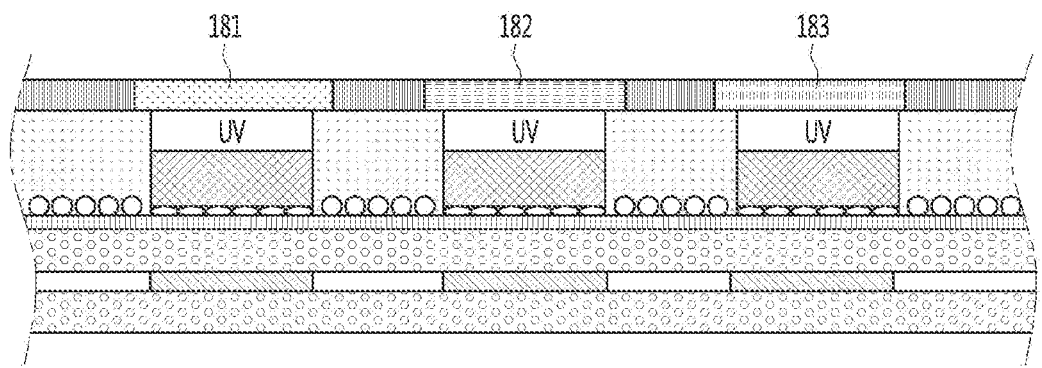

[FIG.6]
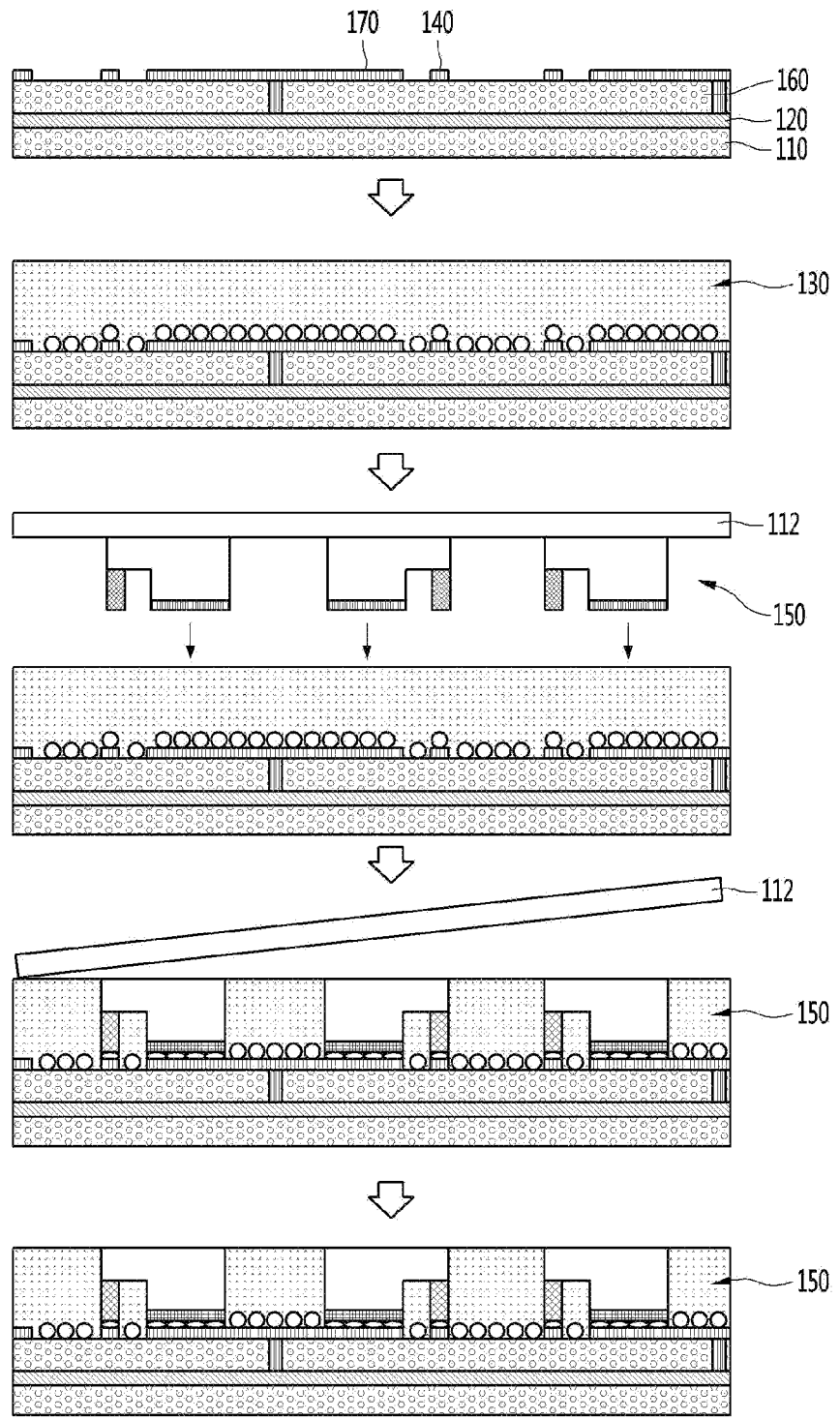

[FIG.7]
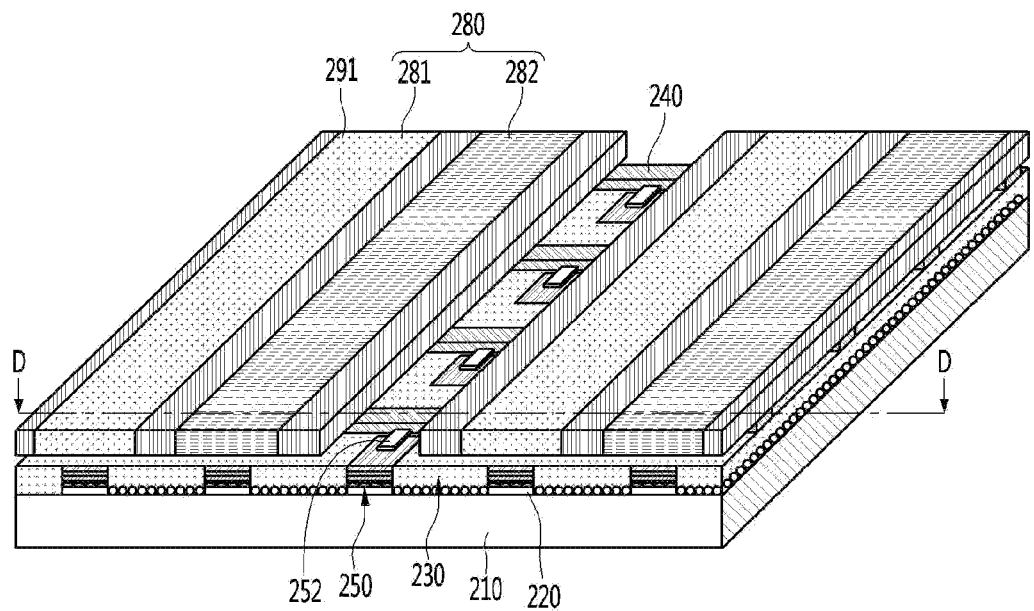
[FIG.8]
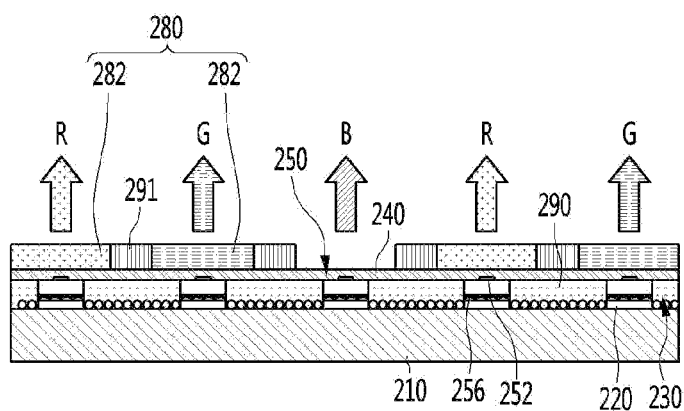

[FIG.9]
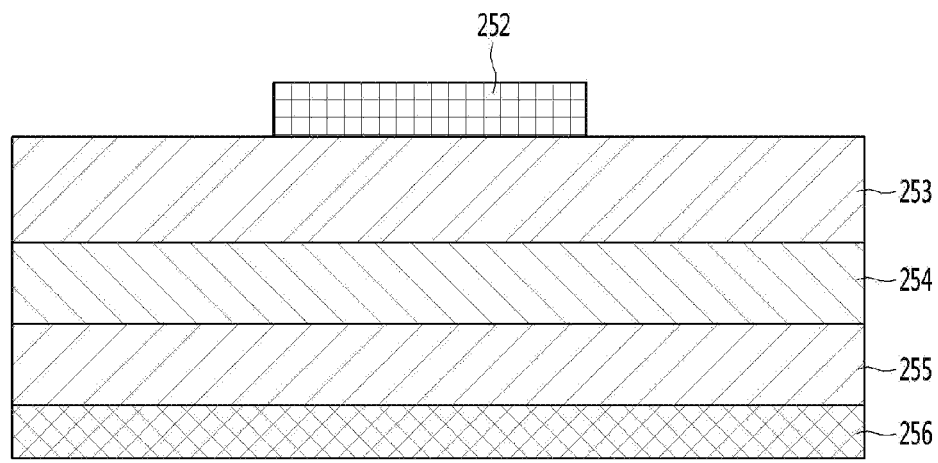
[FIG.10]
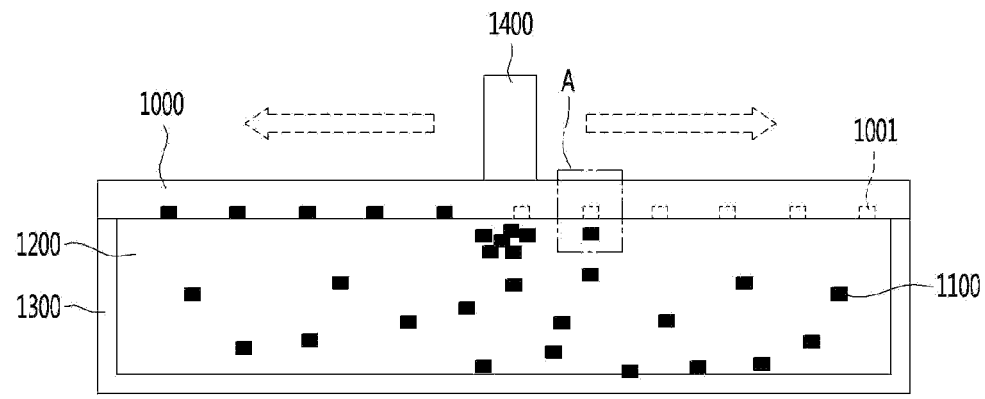

[FIG.11]
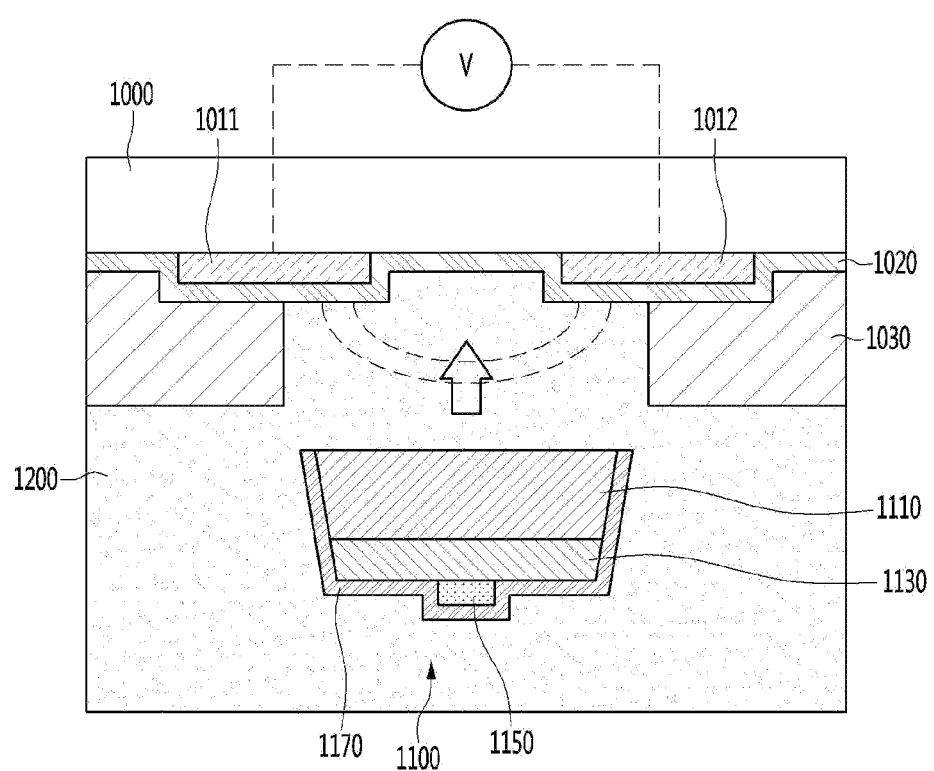

[FIG.12]
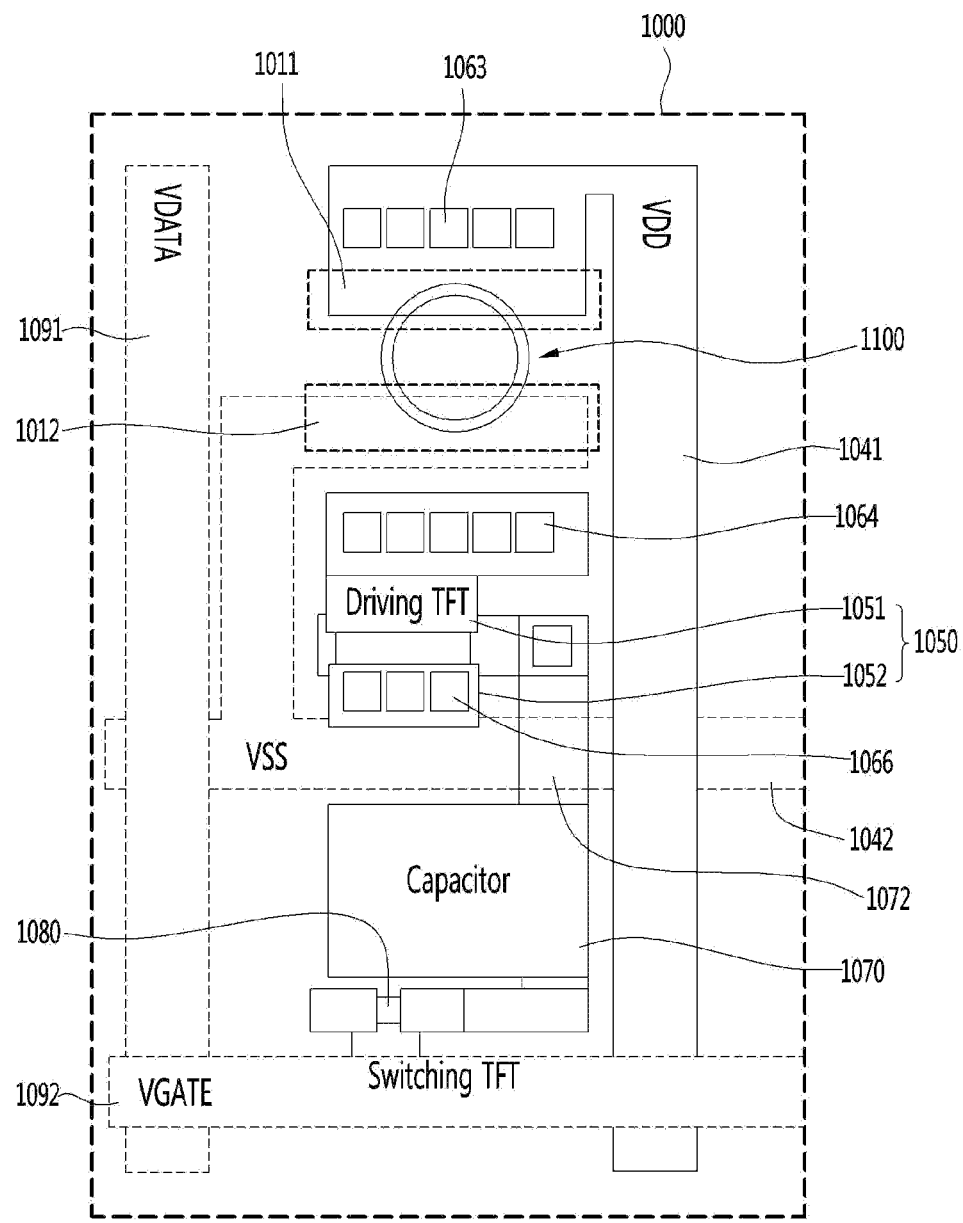

[FIG.13]
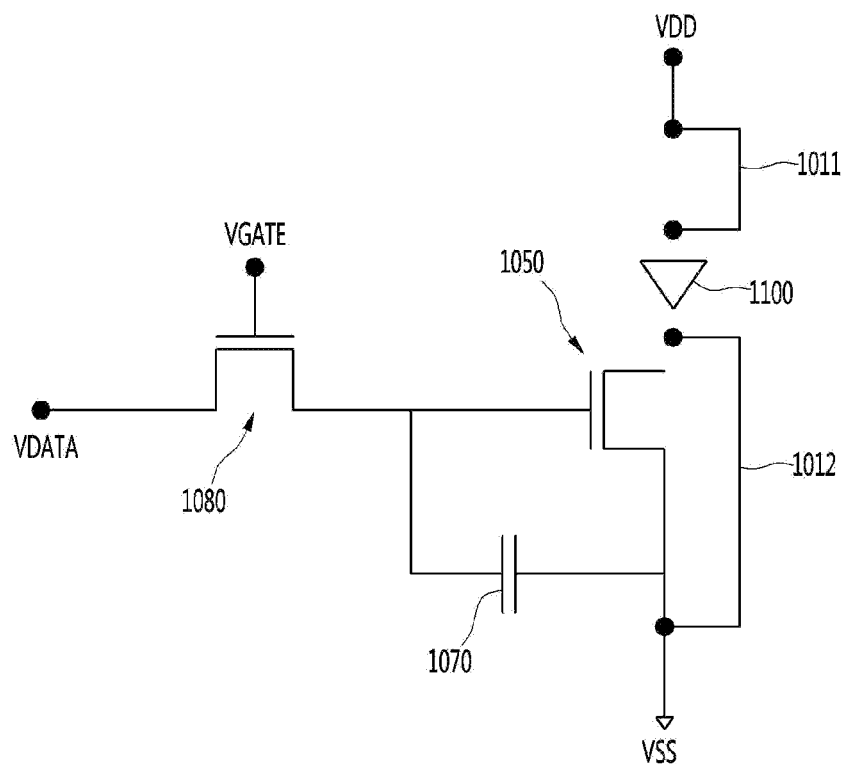

[FIG.14]
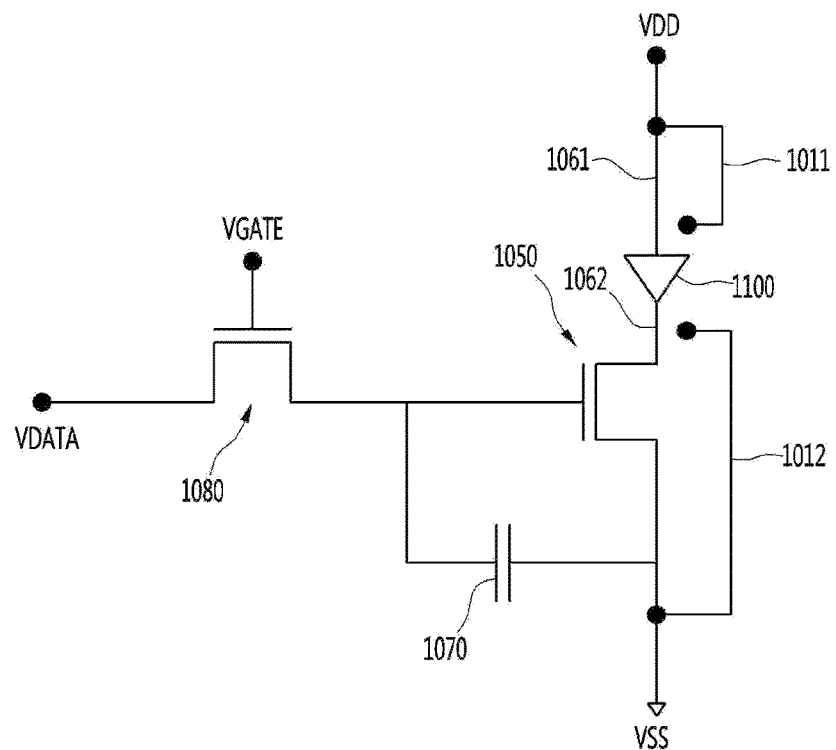
[FIG.15]
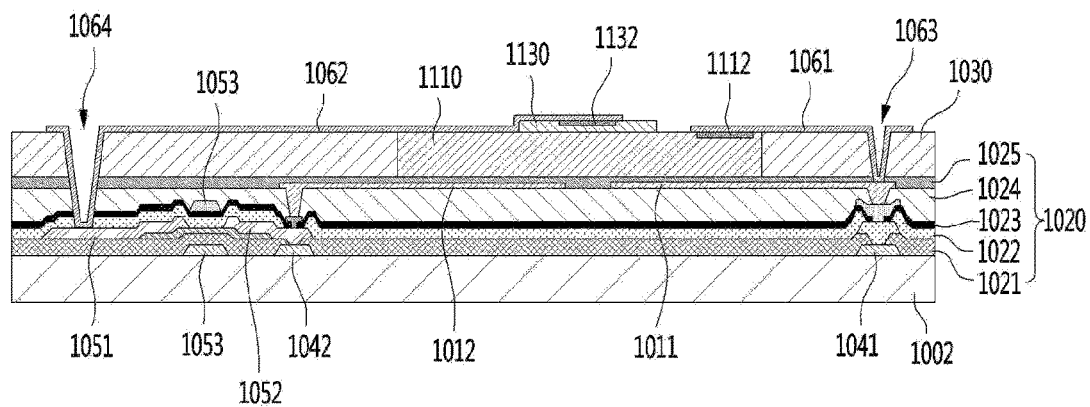

[FIG.16]
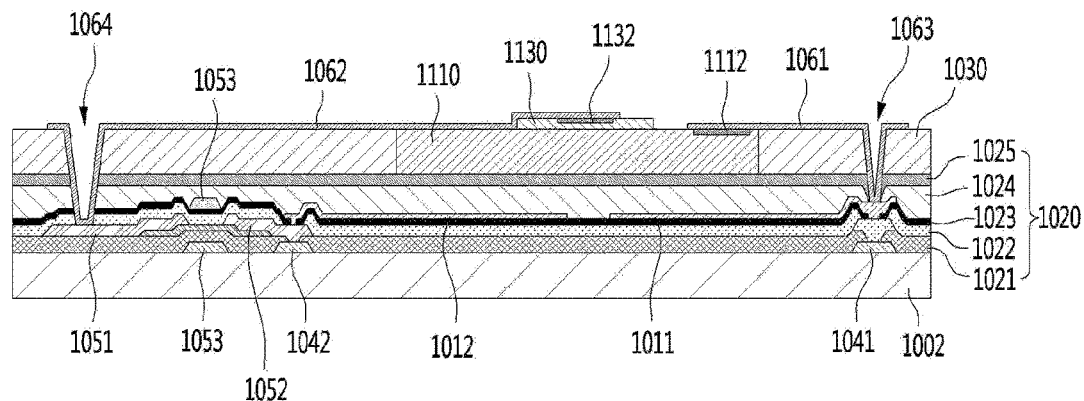
[FIG.17]
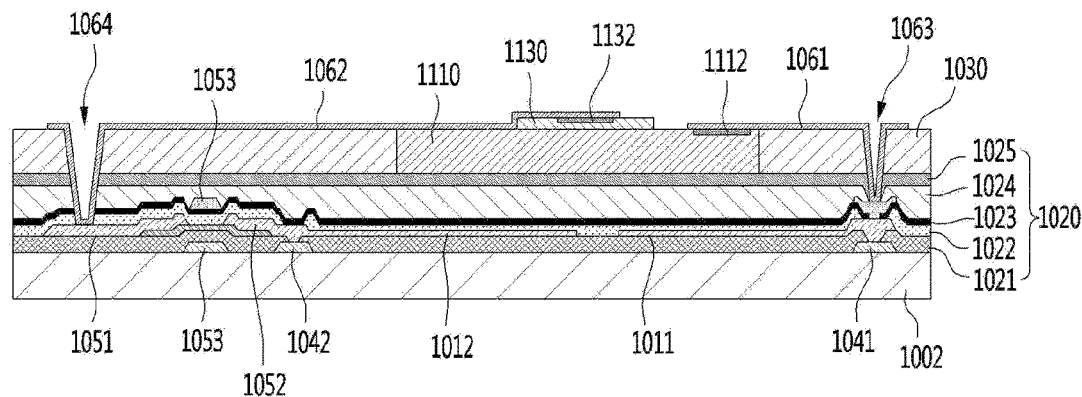
[FIG.18]
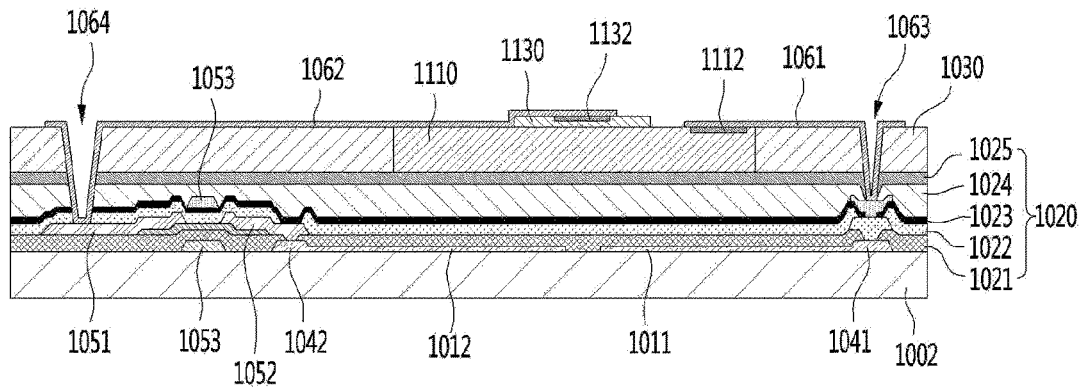

DISPLAY APPARATUS USING SEMICONDUCTOR LIGHT-EMITTING DEVICES

CROSS REFERENCE TO RELATED APPLICATIONS

This application is the National Stage filing under 35 U.S.C. 371 of International Application No. PCT/KR2019/016978, filed on Dec. 4, 2019, which claims the benefit of earlier filing date and right of priority to Korean Application No. 10-2019-0024916, filed on Mar. 4, 2019 in the Republic of Korea, the entire contents of all these applications being hereby expressly incorporated by reference into the present application.

TECHNICAL FIELD

The present invention relates to a display device using a semiconductor light emitting device.

BACKGROUND ART

Recently, in the field of display technology, display devices having excellent characteristics such as thinness and flexibility have been developed. On the other hand, currently commercialized main displays are represented by LCD (Liquid Crystal Display) and AMOLED (Active-Matrix Organic Light Emitting Diodes).

However, in the case of LCD, there are problems in that the response time is not fast and it is difficult to implement flexible, and in the case of AMOLED, there are weaknesses in that the life is short and the mass production yield is not good.

Meanwhile, a light emitting (diode (LED) is a well-known semiconductor light emitting device that converts electric current into light. It has been used as a light source for display images of electronic devices including information and communication devices. Accordingly, a method for solving the above problems by implementing a display using the semiconductor light emitting device may be proposed. Such a light emitting diode has various advantages, such as a long life, low power consumption, excellent initial driving characteristics, and high vibration resistance, compared to a filament-based light emitting device.

Meanwhile, in the case of a display using a semiconductor light emitting device, since the semiconductor light emitting device corresponding to each pixel must be coupled to the substrate during the transfer process, it may be relatively difficult to implement a large-screen high-pixel display. Accordingly, recently, a self-assembly method has been developed in which semiconductor light emitting devices injected into a fluid are moved to a substrate using an electromagnetic field and then assembled.

DISCLOSURE

Technical Problem

An object of the present invention is to provide a display device in which an efficient wiring process is implemented in an assembly electrode implemented in a display panel according to a self-assembly method.

Technical Solution

A display device according to an embodiment of the present invention may include a substrate, a power wiring and a ground wiring disposed on the substrate to be spaced apart from each other, a driving TFT disposed on the substrate and having a source terminal electrically connected to the ground wiring, at least one insulating layer disposed on the substrate and a pair of assembly electrodes spaced apart from each other between any one of the at least one insulating layer and the substrate. And the pair of assembly electrodes may generate an electric field as a voltage is applied to any one of the assembly electrodes.

A first assembly electrode of the pair of assembly electrodes can be electrically connected to the power wiring, and a second assembly electrode of the pair of assembly electrodes can be electrically connected to the ground wiring.

According to an embodiment, the pair of assembly electrodes can be formed on the substrate, the first assembly electrode can be formed to extend from the power wiring, and the second assembly electrode can be formed to extend from the ground wiring.

According to an embodiment, the at least one insulating layer may include a first insulating layer covering the substrate, the power wiring, and the ground wiring, the first assembly electrode, the second assembly electrode, and the source terminal can be formed on the first insulating layer, the first assembly electrode can be electrically connected to the power wiring through an etching region formed on the power wiring of the first insulating layer, and the second assembly electrode can be formed to extend from the source terminal and can be electrically connected to the ground wire through an etch region formed on the ground wire in the first insulating layer.

According to an embodiment, the at least one insulating layer may include a first insulating layer covering the substrate, the power wiring, and the ground wiring, a second insulating layer covering the source terminal formed on the first insulating layer and covering the first insulating layer and a third insulating layer covering the first assembly electrode and the second assembly electrode formed on the second insulating layer, and the second insulating layer. And the first assembly electrode may be electrically connected to the power wiring through an etch region formed in each of the first insulating layer and the second insulating layer on the power wiring and the second assembly electrode may be electrically connected to the source terminal and the ground wire through an etch region formed in the second insulating layer on the ground wire.

The display device may further include a semiconductor light emitting device assembled on the at least one insulating layer, and the semiconductor light emitting device can be positioned on the pair of assembly electrodes.

The display device may further include a partition wall formed on the at least one insulating layer, and a portion of the partition wall can be removed so that a bottom surface of the semiconductor light emitting device can be in contact with the at least one insulating layer.

The display device may further include a first wiring electrically connecting a first electrode formed in the semiconductor light emitting device and the power wiring and a second wiring electrically connecting a second electrode formed on the semiconductor light emitting device and a drain terminal of the driving TFT.

In an embodiment, the first wiring can be electrically connected to the power wiring through a partition wall on the power wiring and a first trench region formed by etching the at least one insulating layer and the second wiring can be electrically connected to the drain terminal through a partition wall on the drain terminal and a second trench region formed by etching the at least one insulating layer.

According to an embodiment, each of the first wiring and the second wiring can be implemented as a transparent electrode.

According to an embodiment, the semiconductor light emitting device may include a magnetic layer having a magnetic material.

Advantageous Effects

According to an embodiment of the present invention, the assembly electrode for self-assembly of the semiconductor light emitting device may be connected to the power supply wiring and the ground wiring of the TFT driving circuit. Accordingly, a separate power wiring for applying a voltage to the assembly electrode may not be implemented in the panel. Therefore, the wiring structure of the panel is prevented from becoming complicated, noise due to wiring can be reduced, and a space utilization within the pixel can be prevented from being lowered.

DESCRIPTION OF DRAWINGS

FIG. 1 is a conceptual diagram illustrating an embodiment of a display device using a semiconductor light emitting device of the present invention.

FIG. 2 is a partially enlarged view of part A of FIG. 1, and FIGS. 3A and 3B are cross-sectional views taken along lines B-B and C-C of FIG. 2.

FIG. 4 is a conceptual diagram illustrating a flip-chip type semiconductor light emitting device of FIG. 3.

FIG. 5A to 5C are conceptual diagrams illustrating various forms of implementing colors in relation to a flip-chip type semiconductor light emitting device.

FIG. 6 is a cross-sectional view showing a method of manufacturing a display device using the semiconductor light emitting device of the present invention.

FIG. 7 is a perspective view showing another embodiment of a display device using the semiconductor light emitting device of the present invention.

FIG. 8 is a cross-sectional view taken along line D-D in FIG. 7.

FIG. 9 is a conceptual diagram illustrating the vertical semiconductor light emitting device of FIG. 8.

FIG. 10 is a diagram schematically illustrating an embodiment of a method for assembling a semiconductor light emitting device to a display panel by a self-assembly method.

FIG. 11 is an enlarged view of part A of FIG. 10.

FIG. 12 is a diagram schematically showing a circuit configuration of a display panel according to an embodiment of the present invention.

FIGS. 13 to 14 are circuit diagrams according to the circuit configuration of the display panel shown in FIG. 12.

FIGS. 15 to 18 are exemplary views showing various arrangement positions of the assembly electrode according to an embodiment of the present invention.

MODE FOR INVENTION

Hereinafter, the embodiments disclosed in the present specification will be described in detail with reference to the accompanying drawings, but the same or similar elements are given the same reference numerals regardless of the reference numerals, and the redundant description thereof will be omitted. The suffixes "module" and "part" for elements used in the following description are given or mixed in consideration of only the ease of writing the specification, and do not have distinct meanings or roles by themselves, in addition, in describing the embodiments disclosed in the present specification, if it is determined that detailed descriptions of related known technologies may obscure the meaning of the embodiments disclosed in the present specification, the detailed description thereof will be omitted. In addition, it should be noted that the accompanying drawings are only for easy understanding of the embodiments disclosed in the present specification, and should not be construed as limiting the technical spirit disclosed herein by the accompanying drawings.

Also, when an element, such as a layer, region, or substrate, is referred to as being "on" another element, it can be understood that it may be directly on the other element or intervening elements may be present in therebetween.

The display device described in this specification may include a mobile phone, a smart phone, a laptop computer, a digital broadcasting terminal, a personal digital assistant (PDA), a portable multimedia player (PMP), a navigation system, a slate PC, a Tablet PC, a Ultra Book, a digital TV, a desktop computer, and the like. However, it will be readily apparent to those skilled in the art that the configuration according to the embodiment described herein may be applied to a display capable device even in a new product form to be developed later.

FIG. 1 is a conceptual diagram illustrating an embodiment of a display device using a semiconductor light emitting device of the present invention.

As shown in drawings, information processed by the control unit of the display apparatus 100 may be displayed using a flexible display.

A flexible display may include a display that can be bent, crooked, twisted, folded, or rolled by an external force. For example, the flexible display may be a display manufactured on a thin and flexible substrate that can be bent, crooked, folded, or rolled like paper while maintaining the display characteristics of a conventional flat panel display.

In a state in which the flexible display is not bent (for example, a state having an infinite radius of curvature, hereinafter referred to as a first state), the display area of the flexible display becomes a flat surface. In a state bent by an external force in the first state (for example, a state having a finite radius of curvature, hereinafter referred to as a second state), the display area may be a curved surface. As illustrated, the information displayed in the second state may be visual information output on the curved surface. Such visual information is implemented by independently controlling the light emission of sub-pixels arranged in a matrix form. The unit pixel means a minimum unit for realizing one color.

The unit pixel of the flexible display may be implemented by a semiconductor light emitting device. In the present invention, a light emitting diode (LED) is exemplified as a type of semiconductor light emitting device that converts current into light. The light emitting diode is formed in a small size, so that it can serve as a unit pixel even in the second state.

Hereinafter, a flexible display implemented using the light emitting diode will be described in more detail with reference to the drawings.

FIG. 2 is a partially enlarged view of part A of FIG. 1, FIGS. 3A and 3B are cross-sectional views taken along lines B-B and C-C of FIG. 2, and FIG. 4 is a conceptual diagram of a flip-chip type semiconductor light emitting device of FIG. 3A, and FIGS. 5A to 5C are conceptual diagrams illustrating various forms of implementing colors in relation to a flip-chip type semiconductor light emitting device.

Referring to FIGS. 2, 3A, and 3B, as the display device 100 using a semiconductor light emitting device, the display device 100 using a passive matrix (PM) type semiconductor light emitting device is exemplified. However, the example described below is also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. For example, to implement a flexible display device, the substrate 110 may include glass or polyimide (PD. In addition, any material such as polyethylene naphthalate (PEN) or polyethylene terephthalate (PET) may be used as long as it has insulating properties and is flexible. In addition, the substrate 110 may be made of either a transparent material or an opaque material.

The substrate 110 may be a wiring substrate on which the first electrode 120 is disposed, and thus, the first electrode 120 may be located on the substrate 110.

As shown in drawings, the insulating layer 160 may be disposed on the substrate 110 on which the first electrode 120 is positioned, and the auxiliary electrode 170 may be positioned on the insulating layer 160. In this case, a state in which the insulating layer 160 is laminated on the substrate 110 may be a single wiring board. More specifically, the insulating layer 160 may be made of an insulating and flexible material such as polyimide (PI), PET, or PEN, and may be integrally formed with the substrate 110 to form a single substrate.

The auxiliary electrode 170 is an electrode that electrically connects the first electrode 120 and the semiconductor light emitting device 150. The auxiliary electrode 170 may be disposed on the insulating layer 160 and may be disposed to correspond to the position of the first electrode 120. For example, the auxiliary electrode 170 may have a dot shape and may be electrically connected to the first electrode 120 by an electrode hole 171 penetrating the insulating layer 160. The electrode hole 171 may be formed by filling the via hole with a conductive material.

Referring to the drawings, the conductive adhesive layer 130 may be formed on one surface of the insulating layer 160, but it is not limited thereto. For example, a layer performing a specific function is formed between the insulating layer 160 and the conductive adhesive layer 130, or the conductive adhesive layer 130 can be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity, and for this purpose, a material having conductivity and a material having adhesiveness may be mixed in the conductive adhesive layer 130. In addition, the conductive adhesive layer 130 may have ductility, thereby enabling a flexible function in the display device.

For this example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the Z direction passing through the thickness, but has electrical insulation in the horizontal X-Y direction. Accordingly, the conductive adhesive layer 130 may be referred to as a Z-axis conductive layer (hereinafter, referred to as a 'conductive adhesive layer').

The anisotropic conductive film may be a film in which an anisotropic conductive medium is mixed with an insulating base member, and when heat and pressure are applied, only a specific portion has conductivity by the anisotropic conductive medium. Hereinafter, it will be described that heat and pressure are applied to the anisotropic conductive film, but other methods are also possible in order for the anisotropic conductive film to have partial conductivity. In this method, for example, only one of the heat and pressure may be applied or UV curing may be performed.

In addition, the anisotropic conductive medium may be, for example, conductive balls or conductive particles. As shown, in this example, the anisotropic conductive film is a film in which conductive balls are mixed with an insulating base member, and when heat and pressure are applied, only a specific portion has conductivity by the conductive balls. The anisotropic conductive film may be in a state in which the core of the conductive material contains a plurality of particles covered by an insulating film made of a polymer material. At this time, the shape of the core may be deformed to form a layer in contact with each other in the thickness direction of the film. As a more specific example, heat and pressure are applied as a whole to the anisotropic conductive film, and electrical connection in the Z-axis direction is partially formed due to a height difference of an object adhered by the anisotropic conductive film.

As another example, the anisotropic conductive film may be in a state in which an insulating core contains a plurality of particles coated with a conductive material. In this case, the conductive material is deformed (pressed) in the portion to which heat and pressure are applied, so that it has conductivity in the thickness direction of the film. As another example, a form in which the conductive material penetrates the insulating base member in the Z-axis direction to have conductivity in the thickness direction of the film is also possible. In this case, the conductive material may have a pointed end.

As shown in drawings, the anisotropic conductive film may be a fixed array anisotropic conductive film (ACF) in which conductive balls are inserted into one surface of the insulating base member. More specifically, the insulating base member is formed of a material having an adhesive property, and the conductive balls are intensively disposed on the bottom of the insulating base member, and when heat and pressure are applied from the base member, it is deformed together with the conductive balls and has conductivity in the vertical direction.

However, the present invention is not necessarily limited thereto, and the anisotropic conductive film may have a form in which conductive balls are randomly mixed in an insulating base member. Or it can be composed of a plurality of layers and conductive balls are arranged on any one layer double-ACF), etc. are all possible.

The anisotropic conductive paste may be in the form of a paste and a conductive ball combined such that it may be a paste in which conductive balls are mixed with an insulating and adhesive base material. Also, a solution containing conductive particles may be a solution containing conductive particles or nano particles.

Referring back to the drawings, the second electrode 140 may be spaced apart from the auxiliary electrode 170 and may be located in the insulating layer 160. That is, the conductive adhesive layer 130 can be disposed on the insulating layer 160 in which the auxiliary electrode 170 and the second electrode 140 are located.

A conductive adhesive layer 130 can be formed in a state in which the auxiliary electrode 170 and the second electrode 140 are positioned on the insulating layer 160. Next, beat and pressure are applied to the semiconductor light emitting device 150 to connect the semiconductor light emitting device 150 in a flip-chip form, so that the semiconductor light emitting device 150 can be electrically connected to the first electrode 120 and the second electrode 140.

Referring to FIG. 4, the semiconductor light emitting device may be a flip chip type light emitting device.

For example, the semiconductor light emitting device may include a p-type electrode 156, a p-type semiconductor layer 155 on which the p-type electrode 156 is formed, and an active layer 154 formed on the p-type semiconductor layer 155, an n-type semiconductor layer 153 formed on the active layer 154 and an n-type electrode 152 spaced apart from the p-type electrode 156 in the horizontal direction on the n-type semiconductor layer 153. In this case, the p-type electrode 156 may be electrically connected to the auxiliary electrode 170 and the conductive adhesive layer 130, and the n-type electrode 152 may be electrically connected to the second electrode 140.

Referring back to FIGS. 2, 3A, and 3B, the auxiliary electrode 170 may be formed to be elongated in one direction, so that one auxiliary electrode can be electrically connected to the plurality of semiconductor light emitting devices 150. For example, p-type electrodes of left and right semiconductor light emitting devices with the auxiliary electrode as the center may be electrically connected to one auxiliary electrode.

More specifically, the semiconductor light emitting device 150 may be press-fitted into the conductive adhesive layer 130 by heat and pressure. Accordingly, only the portion between the p-type electrode 156 and the auxiliary electrode 170 of the semiconductor light emitting device 150 and the portion between the n-type electrode 152 and the second electrode 140 of the semiconductor light emitting device 150 can have conductivity. The remaining portion without press-fitting of the semiconductor light emitting device does not have conductivity. As described above, the conductive adhesive layer 130 not only interconnects the semiconductor light emitting device 150 with the auxiliary electrode 170, the second electrode 140, but also forms an electrical connection.

In addition, the plurality of semiconductor light emitting devices 150 constitute a light emitting device array, and the phosphor layer 180 can be formed on the light emitting device array.

The light emitting device array may include a plurality of semiconductor light emitting devices having different luminance values. Each semiconductor light emitting device 150 constitutes a unit pixel and can be electrically connected to the first electrode 120. For example, there may be a plurality of first electrodes 120, the semiconductor light emitting devices may be arranged in, for example, several columns, and the semiconductor light emitting devices of each column may be electrically connected to any one of the plurality of first electrodes.

In addition, since the semiconductor light emitting devices are connected in a flip-chip form, semiconductor light emitting devices grown on a transparent dielectric substrate can be used. In addition, the semiconductor light emitting devices may be, for example, nitride semiconductor light emitting devices. Since the semiconductor light emitting device 150 has excellent luminance, individual unit pixels can be configured even with a small size.

As shown in drawings, the partition walls 190 may be formed between the semiconductor light emitting devices 150. In this case, the partition wall 190 may serve to separate individual unit pixels from each other, and may be integrally formed with the conductive adhesive layer 130. For example, by inserting the semiconductor light emitting device 150 into the anisotropic conductive film, the base member orf the anisotropic conductive film may form the partition wall.

In addition, when the base member of the anisotropic conductive film is black, the partition wall 190 may have reflective properties and increase contrast even without a separate black insulator.

As another example, a reflective partition wall may be separately provided as the partition wall 190. In this case, the partition wall 190 may include a black or white insulator depending on the purpose of the display device. When the partition wall of the white insulator is used, it is possible to increase reflectivity, and when the partition wall of the black insulator is used, it is possible to have reflective properties and increase the contrast.

A phosphor layer 180 may be located on an outer surface of the semiconductor light emitting device 150. For example, the semiconductor light emitting device 150 is a blue semiconductor light emitting device that emits blue (B) light, and the phosphor layer 180 functions to convert the blue (B) light into the color of a unit pixel. The phosphor layer 180 may be a red phosphor 181 or a green phosphor 182 constituting an individual pixel.

That is, a red phosphor 181 capable of converting blue light into red (R) light may be stacked on the blue semiconductor light emitting device at a position constituting the red unit pixel. In addition, a green phosphor 182 capable of converting blue light into green (G) light may be stacked on the blue semiconductor light emitting device at a position forming the green unit pixel. In addition, only the blue semiconductor light emitting device may be used alone in the portion constituting the blue unit pixel. In this case, unit pixels of red (R), green (G), and blue (B) may form one pixel. More specifically, a phosphor of one color may be stacked along each line of the first electrode 120. Accordingly, one line in the first electrode 120 may be an electrode for controlling one color. That is, red (R), green (G), and blue (B) may be sequentially disposed along the second electrode 140, thereby realizing a unit pixel.

However, the present invention is not necessarily limited thereto, and instead of the phosphor, the semiconductor light emitting device 150 and the quantum dot (QD) are combined to implement red (R), green (G) and blue (B) unit pixels.

In addition, a black matrix 191 may be disposed between the respective phosphor layers to improve contrast. That is, the black matrix 191 may improve contrast of light and dark.

However, the present invention is not necessarily limited thereto, and other structures for implementing blue, red, and green colors may be applied.

Referring to FIG. 5A, each semiconductor light emitting device 150 is mainly gallium nitride (GaN), indium (In) and/or aluminum (Al) can be added together to emit various light including blue such that can be implemented as a high-output light emitting device.

In this case, the semiconductor light emitting device 150 may be a red, green, and blue semiconductor light emitting device to form a sub-pixel, respectively. For example, red, green, and blue semiconductor light emitting devices R, G, and B are alternately arranged, and unit pixels of red, green, and blue are formed by the red, green and blue semiconductor light emitting devices such that a full-color display can be realized.

Referring to FIG. 5B, the semiconductor light emitting device may include a white light emitting device W in which a yellow phosphor layer is provided for each device. In this case, a red phosphor layer 181, a green phosphor layer 182, and a blue phosphor layer 183 may be provided on the white light emitting device W to form a unit pixel. In addition, a unit pixel may be formed on the white light emitting device W by using a color filter in which red, green, and blue are repeated.

Referring to FIG. 5C, a structure in which a red phosphor layer 181, a green phosphor layer 182, and a blue phosphor layer 183 are provided on the ultraviolet light emitting device UV is also possible. In this way, the semiconductor light emitting device can be used in the entire region not only for visible light but also for ultraviolet (UV) light, and can be extended to form a semiconductor light emitting device in which ultraviolet (UV) can be used as an excitation source of the upper phosphor.

Referring back to this example, the semiconductor light emitting device 150 can be positioned on the conductive adhesive layer 130 to constitute a unit pixel in the display device. Since the semiconductor light emitting device 150 has excellent luminance, individual unit pixels can be configured even with a small size. The size of the individual semiconductor light emitting device 150 may have a side length of 80 µm or less, and may be a rectangular or square device. In the case of a rectangle, the size may be 20×80 µm or less.

In addition, even when a square semiconductor light emitting device 150 having a side length of 10 µm can be used as a unit pixel, sufficient brightness to form a display device appears. Accordingly, for example, when a unit pixel is a rectangular pixel having one side of 600 µm and the other side of 300 µm, the distance between the semiconductor light emitting devices is relatively large. Accordingly, in this case, it is possible to implement a flexible display device having a high picture quality higher than or equal to HD picture quality.

The display device using the semiconductor light emitting device described above can be manufactured by a new type of manufacturing method. Hereinafter, the manufacturing method will be described with reference to FIG. 6.

FIG. 6 is a cross-sectional view illustrating a method of manufacturing a display device using a semiconductor light emitting device of the present invention.

Referring to this drawing, firstly, the conductive adhesive layer 130 can be formed on the insulating layer 160 in which the auxiliary electrode 170 and the second electrode 140 are positioned. An insulating layer 160 can be laminated on the first substrate 110 to form one substrate wiring substrate), and the wiring substrate may include a first electrode 120, an auxiliary electrode 170, and a second electrode 140. In this case, the first electrode 120 and the second electrode 140 may be disposed in a mutually orthogonal direction. In addition, in order to implement a flexible display device, the first substrate 110 and the insulating layer 160 may each include glass or polyimide (PI).

The conductive adhesive layer 130 may be implemented by, for example, an anisotropic conductive film, and for this purpose, the anisotropic conductive film may be applied to the substrate on which the insulating layer 160 is located.

Next, the second substrate 112 can be disposed to correspond to the positions of the auxiliary electrode 170 and the second electrodes 140, and a plurality of semiconductors constituting individual pixels provided on the second substrate 112 may be disposed to face the auxiliary electrode 170 and the second electrode 140.

In this case, the second substrate 112 is a growth substrate on which the semiconductor light emitting device 150 is grown, and may be a sapphire substrate or a silicon substrate.

When the semiconductor light emitting device is formed in units of wafers, the semiconductor light emitting device can be effectively used in a display device by having an interval and a size that can form a display device.

Next, the wiring board and the second board 112 can be thermocompression-bonded. For example, the wiring substrate and the second substrate 112 may be thermocompression-bonded by applying an ACF press head. The wiring substrate and the second substrate 112 are bonded by the thermocompression bonding. Only a portion between the semiconductor light emitting device 150 and the auxiliary electrode 170 and the second electrode 140 may have conductivity due to the properties of the anisotropic conductive film having conductivity by thermocompression bonding. Accordingly, the electrodes and the semiconductor light emitting device 150 may be electrically connected. At this time, the semiconductor light emitting device 150 can be inserted into the anisotropic conductive film, through which a partition wall may be formed between the semiconductor light emitting devices 150.

Next, the second substrate 112 can be removed. For example, the second substrate 112 may be removed using a laser lift-off (LLO) method or a chemical lift-off (CLO) method.

Finally, the second substrate 112 can be removed to expose the semiconductor light emitting devices 150 to the outside. If necessary, a transparent insulating layer (not shown) may be formed by coating silicon oxide (SiOx) or the like on the wiring board to which the semiconductor light emitting device 150 is coupled.

The method may further include forming a phosphor layer on one surface of the semiconductor light-emitting device 150. For example, when the semiconductor light emitting device 150 is a blue semiconductor light emitting device that emits blue (B) light, a red phosphor or a green phosphor may be arranged in a layer form on one surface of the blue semiconductor light emitting device to convert blue (B) light into a color of a unit pixel.

The manufacturing method or structure of the display device using the semiconductor light emitting device described above may be modified in various forms. As an example, a vertical semiconductor light emitting device may also be applied to the display device described above. Hereinafter, a vertical structure will be described with reference to FIGS. 5 and 6.

In addition, in the modification or embodiment described below, the same or similar reference numerals are assigned to the same or similar elements as in the previous example, and the description is replaced with the first description.

FIG. 7 is a perspective view showing another embodiment of a display device using the semiconductor light emitting device of the present invention, FIG. 8 is a cross-sectional view taken along line D-D of FIG. 7, and FIG. 9 is a conceptual diagram showing the vertical semiconductor light emitting device of FIG. 8.

Referring to the drawings, the display device may be a display device using a passive matrix (PM) type vertical semiconductor light emitting device.

The display device may include a substrate 210, a first electrode 220, a conductive adhesive layer 230, a second electrode 240, and a plurality of semiconductor light emitting devices 250.

The substrate 210 may be a wiring substrate on which the first electrode 220 is disposed, and may include polyimide (Pt) to implement a flexible display device. In addition, any material that has insulating properties and is flexible may be used.

The first electrode 220 may be positioned on the substrate 210, and may be formed as a bar-shaped electrode long in one direction. The first electrode 220 may serve as a data electrode.

The conductive adhesive layer 230 may be formed on the substrate 210 on which the first electrode 220 is located. Like a display device to which a flip chip type light emitting device is applied, the conductive adhesive layer 230 may be an anisotropic conductive film (ACF), an anisotropic conductive paste, and a solution containing conductive particles and so on. However, in this embodiment as well, a case in which the conductive adhesive layer 230 is implemented by an anisotropic conductive film will be exemplified.

When the semiconductor light emitting device 250 is connected by applying heat and pressure after the anisotropic conductive film is placed on the substrate 210 in a state where the first electrode 220 is positioned, the semiconductor light emitting device 250 can be electrically connected to the first electrode 220. In this case, the semiconductor light emitting device 250 is preferably disposed on the first electrode 220.

As described above, the electrical connection is generated because the anisotropic conductive film has conductivity in the thickness direction when heat and pressure are applied in part. Accordingly, the anisotropic conductive film is divided into a conductive portion and a non-conductive portion in the thickness direction.

In addition, since the anisotropic conductive film contains an adhesive element, the conductive adhesive layer 230 implements not only electrical connection but also mechanical bonding between the semiconductor light emitting device 250 and the first electrode 220.

As described above, the semiconductor light emitting device 250 is positioned on the conductive adhesive layer 230 and constitutes individual pixels in the display device through this. Since the semiconductor light emitting device 250 has excellent luminance, individual unit pixels can be configured even with a small size. The size of the individual semiconductor light emitting device 250 may have a side length of 80 μm or less, and may be a rectangular or square device. In the case of a rectangular shape, the size may be 20×80 μm or less.

The semiconductor light emitting device 250 may have a vertical structure.

A plurality of second electrodes 240 is disposed between the vertical semiconductor light emitting devices in a direction crossing the longitudinal direction of the first electrode 220 and are provided to be electrically connected the vertical semiconductor light emitting device 250.

Referring to FIG. 9, such a vertical semiconductor light emitting device may include a p-type electrode 256, a p-type semiconductor layer 255 formed on the p-type electrode 256, and a p-type semiconductor layer 255 formed on the p-type semiconductor layer 255, an active layer 254, an n-type semiconductor layer 253 formed on the active layer 254, and an n-type electrode 252 formed on the n-type semiconductor layer 253. In this case, the lower p-type electrode 256 may be electrically connected to the first electrode 220 and the conductive adhesive layer 230, and the upper n-type electrode 252 may be electrically connected to a second electrode 240 to be described later. The vertical semiconductor light emitting device 250 has a great advantage in that it is possible to reduce the chip size because electrodes can be arranged up and down.

Referring back to FIG. 8, a phosphor layer 280 may be formed on one surface of the semiconductor light emitting device 250. For example, when the semiconductor light emitting device 250 is a blue semiconductor light emitting device 251 that emits blue (B) light, and a phosphor layer 280 for converting the blue (B) light into the color of a unit pixel can be provided. In this case, the phosphor layer 280 may be a red phosphor 281 and a green phosphor 282 constituting individual pixels.

That is, a red phosphor 281 capable of converting blue light into red (R) light may be stacked on the blue semiconductor light emitting device at a position constituting the red unit pixel. In addition, a green phosphor 282 capable of converting blue light into green (G) light may be stacked on the blue semiconductor light emitting device at a position forming the green unit pixel. In addition, only the blue semiconductor light emitting device may be used alone in the portion constituting the blue unit pixel. In this case, unit pixels of red (R), green (G), and blue (B) may form one pixel.

However, the present invention is not necessarily limited thereto, and as described above in a display device to which a flip chip type light emitting device is applied, other structures for realizing blue, red, and green may be applied.

Referring to this embodiment again, the second electrode 240 may be positioned between the semiconductor light emitting devices 250 and may be electrically connected to the semiconductor light emitting devices 250. For example, the semiconductor light emitting devices 250 may be arranged in a plurality of columns, and the second electrode 240 may be positioned between the columns of the semiconductor light emitting devices 250.

Since the distance between the semiconductor light emitting devices 250 constituting individual pixels is sufficiently large, the second electrode 240 may be positioned between the semiconductor light emitting devices 250.

The second electrode 240 may be formed as a long bar-shaped electrode in one direction, and may be disposed in a direction perpendicular to the first electrode.

In addition, the second electrode 240 and the semiconductor light emitting device 250 may be electrically connected by a connection electrode protruding from the second electrode 240. More specifically, the connection electrode may be an n-type electrode of the semiconductor light emitting device 250. For example, the n-type electrode is formed as an ohmic electrode for ohmic contact, and the second electrode covers at least a portion of the ohmic electrode by printing or deposition. Through this, the second electrode 240 and the n-type electrode of the semiconductor light emitting device 250 may be electrically connected.

As shown in drawings, the second electrode 240 may be positioned on the conductive adhesive layer 230. In some cases, a transparent insulating layer (not shown) including silicon oxide (SiOx) may be formed on the substrate 210 on which the semiconductor light emitting device 250 is formed. When the second electrode 240 is positioned after the transparent insulating layer is formed, the second electrode 240 is positioned on the transparent insulating layer. In addition, the second electrode 240 may be formed to be spaced apart from the conductive adhesive layer 230 or the transparent insulating layer.

If a transparent electrode such as indium tin oxide (ITO) is used to position the second electrode 240 on the semiconductor light emitting device 250, there is a problem in that the ITO material has bad adhesion to the n-type semiconductor layer. Accordingly, the present invention has the advantage of not using a transparent electrode such as ITO by locating the second electrode 240 between the semiconductor light emitting devices 250. Therefore, it is possible to improve light extraction efficiency by using a conductive material having good adhesion to the n-type semiconductor layer as a horizontal electrode without being limited by the selection of a transparent material.

According to the drawings, a partition wall 290 may be positioned between the semiconductor light emitting devices 250. That is, in order to isolate the semiconductor light emitting devices 250 constituting individual pixels, a partition wall 290 may be disposed between the vertical semiconductor light emitting devices 250. In this case, the partition wall 290 may serve to separate individual unit pixels from each other, and may be integrally formed with the conductive adhesive layer 230. For example, by inserting the semiconductor light emitting device 250 into the anisotropic conductive film, the base member of the anisotropic conductive film may form the partition wall.

In addition, when the base member of the anisotropic conductive film is black, the partition wall 290 may have reflective properties and increase contrast even without a separate black insulator.

As another example, as the partition wall 190, a reflective partition wall may be separately provided. The partition wall 290 may include a black or white insulator depending on the purpose of the display device.

If the second electrode 240 is directly positioned on the conductive adhesive layer 230 between the semiconductor light emitting device 250, the partition wall 290 can be disposed between the vertical semiconductor light emitting device 250 and the second electrode 240. Accordingly, individual unit pixels can be configured with a small size by using the semiconductor light emitting device 250, and the distance between the semiconductor light emitting devices 250 is relatively large enough to connect the second electrode 240 to the semiconductor light emitting device 250, and there is an effect of realizing a flexible display device having HD image quality.

Also, as illustrated, a black matrix 291 may be disposed between each phosphor to improve contrast. That is, the black matrix 291 may improve contrast of light and dark.

As described above, the semiconductor light emitting device 250 can be positioned on the conductive adhesive layer 230 and constitutes individual pixels in the display device. Since the semiconductor light emitting device 250 has excellent luminance, individual unit pixels can be configured even with a small size. Accordingly, a full-color display in which unit pixels of red (R), green (G), and blue (B) constitute one pixel can be implemented by the semiconductor light emitting device.

FIG. 10 is a diagram schematically illustrating an embodiment of a method for assembling a semiconductor light emitting device to a display panel by a self-assembly method, and FIG. 11 is an enlarged view of part A of FIG. 10.

An example in which a semiconductor light emitting device is assembled in a display panel by a self-assembly method using an electromagnetic field will be briefly described with reference to FIGS. 10 to 11.

Referring to FIGS. 10 to 11, the semiconductor light emitting device 1100 may be introduced into a chamber 1300 filled with a fluid 1200.

The semiconductor light emitting device 1100 may be implemented as the horizontal semiconductor light emitting device shown in FIG. 4 or the vertical semiconductor light emitting device shown in FIG. 9. In addition, the semiconductor light emitting device 1100 may include a magnetic layer 1150 having a magnetic material. The magnetic layer may include a magnetic metal such as nickel (Ni). Since the semiconductor light emitting device 1100 injected into the fluid includes the magnetic layer 1150, it moves to the display panel 1000 (hereinafter defined as 'panel') by the magnetic field generated from the assembly apparatus 1400 and can be assembled to the panel 1000.

Referring to the flipped semiconductor light emitting device 1100 shown in FIG. 11, the magnetic layer 1150 of the semiconductor light emitting device 1100 is shown as being disposed on the p-type semiconductor layer 1130, but the arrangement position of the magnetic layer 1150 may be changed according to the manufacturing method of the light emitting device 1100.

Meanwhile, a passivation layer 1170 surrounding the top and side surfaces of the semiconductor light emitting device 1100 may be formed on the semiconductor light emitting device 1100. Since the passivation layer 1170 is formed while the semiconductor light emitting device 1100 is connected to a growth substrate (not shown), the passivation layer 1170 may not be formed on the bottom surface of the semiconductor light emitting device 1100.

The passivation layer 1170 can be formed through an inorganic insulator such as silica, alumina, PECVD (Plasma Enhanced Chemical Vapor Deposition), LPCVD (Low Pressure CVD), sputtering deposition method, or the like, or it may be formed through a method of spin coating an organic material such as or a photoresist, a polymer material.

Meanwhile, an n-type electrode may be connected to the n-type semiconductor layer 1110, and a p-type electrode may be connected to the p-type semiconductor layer 1130. To this end, some regions of the n-type semiconductor layer 1110 and the p-type semiconductor layer 1130 is exposed to the outside. Accordingly, in the manufacturing process of the display device after the semiconductor light emitting device 1100 is assembled to the panel 1000, a partial region of the passivation layer 1170 may be etched.

After the semiconductor light emitting device 1100 is put into the chamber 1300, the panel 1000 may be disposed on the chamber 1300. According to an embodiment, the panel 1000 may be introduced into the chamber 1300.

A pair of assembly electrodes 1011 and 1012 corresponding to each of the semiconductor light emitting devices 1100 to be assembled may be formed on the panel 1000. The assembly electrodes 1011 and 1012 may be implemented as transparent electrodes (ITO) or other common materials. The assembly electrodes 1011 and 1012 may fix the semiconductor light emitting device 1100 injected into the coupling hole 1001 by emitting an electric field as a voltage is applied thereto. The distance between the assembly electrodes 1011 and 1012 is formed to be smaller than the width of the semiconductor light emitting device 1100 and the width of the coupling hole 1001, so that the assembly position of the semiconductor light emitting device 1100 using an electric field can be more precisely fixed.

An insulating layer 1020 can be formed on the assembly electrodes 1011 and 1012 to protect the assembly electrodes 1011 and 1012 from the fluid 1200, and to prevent leakage of current flowing through the assembly electrodes 1011 and

1012. For example, the insulating layer 1020 may be formed of a single layer or multiple layers of an inorganic insulator such as silica or alumina or an organic insulator. The insulating layer 1020 may have a minimum thickness for preventing damage to the assembly electrodes 1011 and 1012 when assembling the semiconductor light emitting device 1100, and may have a maximum thickness for stably assembling the semiconductor light emitting device 1100.

A partition wall 1030 may be formed on the insulating layer 1020. Partial regions of the partition wall 1030 may be positioned on the assembly electrodes 1011 and 1012, and the remaining regions may be positioned on the panel 1000.

For example, when the panel 1000 is manufactured, a portion of the partition wall formed on the entire upper portion of the insulating layer 1020 is removed, a coupling hole 1001 can be formed such that each of the semiconductor light emitting devices 1100 is coupled and assembled to the panel 1000.

A coupling hole 1001 to which the semiconductor light emitting devices 1100 are coupled is formed in the panel 1000, and a surface on which the coupling hole 1001 is formed may be in contact with the fluid 1200. The coupling hole 1001 may guide an accurate assembly position of the semiconductor light emitting device 1100.

Meanwhile, the coupling hole 1001 may have a shape and a size corresponding to the shape of the semiconductor light emitting device 1100 to be assembled at a corresponding position. Accordingly, it is possible to prevent assembling other semiconductor light emitting devices or assembling a plurality of semiconductor light emitting devices in the coupling hole 1001.

After the panel 1000 is disposed, the assembly apparatus 1400 including the magnetic material may move along the panel 1000. The assembly apparatus 1400 may move while in contact with the panel 1000 in order to maximize the area applied by the magnetic field into the fluid 1200. According to an embodiment, the assembly apparatus 1400 may include a plurality of magnetic materials or a magnetic material having a size corresponding to that of the panel 1000. In this case, the moving distance of the assembly apparatus 1400 may be limited within a predetermined range.

By the magnetic field generated by the assembly apparatus 1400, the semiconductor light emitting device 1100 in the chamber 1300 may move toward the assembly apparatus 1400 and the panel 1000.

The semiconductor light emitting device 1100 may enter the coupling hole 1001 and come into contact with the panel 1000 while moving toward the assembly apparatus 1400. For example, a pattern or shape for the n-type semiconductor layer 1110 of the semiconductor light emitting device 1100 to contact the panel 1000 may be formed in the coupling hole 1001 and/or the semiconductor light emitting device 1100.

In addition, the electric field by the assembly electrodes 1011 and 1012 formed on the panel 1000 can prevent the semiconductor light emitting device 1100 in contact with the panel 1000 from being separated by the movement of the assembly apparatus 1400.

That is, by the self-assembly method using the above-described electromagnetic field, the time required for each of the semiconductor light emitting devices to be assembled on the substrate can be rapidly reduced, so that a large-area high-pixel display can be implemented more quickly and economically.

However, in the case of the self-assembly method, the assembly electrodes 1011 and 1012 for assembling the semiconductor light emitting device 1100 to the panel 1000 by applying an electric field to the panel 1000 are needed. In addition, a separate wiring for applying a voltage to the assembly electrodes 1011 and 1012 may be required in the panel 1000. In this case, an additional process is required to implement the separate wiring. Also, depending on the implementation of the wiring, noise may be generated in other circuits or a reduction of space utilization in display pixels may occur.

A display device according to an embodiment of the present invention for solving the above-described problem will be described with reference to FIGS. 12 to 18 below.

FIG. 12 is a diagram schematically showing a circuit configuration of a display panel according to an embodiment of the present invention.

Referring to FIG. 12, a driving circuit for controlling each of the pixels implemented by the semiconductor light emitting devices 1100 may be implemented in the panel 1000. For example, the driving circuit may be implemented as a thin film transistor (TFT) driving circuit.

The TFT driving circuit is a known configuration, for example, the TFT driving circuit may include a power supply wiring (or a drain wiring VDD 1041)) supplying a voltage for one frame, a ground wiring (or a source wiring VSS 1042), a capacitor 1070 storing a voltage for a pixel, a driving TFT 1050 connected to the capacitor 1070 by the wiring 1072 and controlling an amount of current flowing to the semiconductor light emitting device 1100 based on the voltage stored in the capacitor 1070, a switch TFT 1080 controlling the light of the entire pixel, a data line VDATA 1091 for applying a voltage to the pixel, and a gate line 1092 for controlling on/off of the switch TFT 1080.

The power wiring 1041 may be connected to the first electrode 1112 (refer to FIG. 15, for example, an n-type electrode) of the semiconductor light emitting device 1100 through a first contact 1063. The drain terminal 1051 of the driving TFT 1050 may be connected to the second electrode 1132 (refer to FIG. 15, for example, a p-type electrode) of the semiconductor light emitting device 1100 through a second contact 1064. Also, the source terminal 1052 of the driving TFT 1050 may be connected to the ground wire 1042 through the third contact 1066. As will be described later with reference to FIGS. 15 to 18, the first contact 1063 and the second contact 1064 may mean a first trench region and a second trench region which are formed by etching at least a portion of the partition wall 1030 and the insulating layer 1020.

On the other hand, the first assembly electrode 1011 and the second assembly electrode 1012 can be arranged such that a partial region overlaps with the semiconductor light emitting device 1100 when viewed from above, so that an electric field to fix the semiconductor light emitting device 1100 on a panel 000 can be effectively applied. In particular, one end of the first assembly electrode 1011 may be connected to the power wiring 1041, and one end of the second assembly electrode 1012 may be connected to the ground wiring 1042. In this case, in the assembly process of the semiconductor light emitting device 1100, as a predetermined voltage can be applied to the first assembly electrode 1011 through the power supply wiring 1041, an electric field can develop between the first assembly electrode 1011 and the second assembly electrode 1012.

When the first assembly electrode 1oll is connected to any one of the other wirings 1091, 1092, and 1072 shown in FIG. 12, in order to apply a voltage to the first assembly electrode 1011, a plurality of wirings voltage are applied to them. That is, according to the embodiment of the present invention, the first assembly electrode 1011 may be connected to the power wiring 1041 to more easily generate an electric field during the assembly process of the semiconductor light emitting device 1100.

FIGS. 13 to 14 are circuit diagrams according to the circuit configuration of the display panel shown in FIG. 12.

Referring to FIG. 13, during the assembly process of the semiconductor light emitting device 1100, when a voltage is applied to the first assembly electrode 1011 having one end connected to the power wiring 1041, an electric field may be generated between the first assembly electrode 1011 and the second assembly electrode 1012, The semiconductor light emitting device 1100 accommodated in the coupling hole 1001 of the panel 1000 by the magnetic field of the assembly apparatus 1400 may maintain a state fixed to the panel 1000 by the electric field.

Referring to FIG. 14, after the semiconductor light emitting device 1100 is assembled, a wiring connection process may be performed. For example, the first wiring 1061 may be connected between the first electrode 1112 (refer to FIG. 15) of the semiconductor light emitting device 1100 and the power wiring 1041. Also, a second wiring 1062 may be connected between the second electrode 1132 (refer to FIG. 15) of the semiconductor light emitting device 1100 and the drain terminal 1051 of the driving TFT 1050. In this case, the other end of the first assembly electrode 1011 or the second assembly electrode 1012 may not be connected to the first wiring 1061 or the second wiring 1062. Accordingly, the first assembly electrode 1011 and the second assembly electrode 1012 may not affect the semiconductor light emitting device 1100 and the TFT driving circuit when the manufactured display device is driven. Meanwhile, the first wiring 1061 and the second wiring 1062 may be implemented as a transparent electrode (ITO).

That is, according to the embodiment of the present invention, the assembly electrodes 1011 and 1012 for self-assembly of the semiconductor light emitting device 1100 are connected to the power supply wiring 1041 and the ground wiring 1042 of the TFT driving circuit such that a separate power wiring for applying a voltage to the assembly electrodes 1011 and 1012 may not be implemented in the panel 1100. Accordingly, it is possible to prevent the wiring structure of the panel 1100 from becoming complicated, reduce noise due to wiring, and prevent a decrease in space utilization within the pixel.

FIGS. 15 to 18 are exemplary views showing various arrangement positions of the assembly electrode according to an embodiment of the present invention.

Referring to FIGS. 15 to 18, assembly electrodes 1011 and 1012 may be formed in various positions of the panel 1100 to be connected to a power supply wiring 1041 and a ground wiring 1042.

First, referring to the embodiment of FIG. 15, on the substrate 1002 of the panel 1100, the power wiring 1041 and the ground wiring 1042 may be disposed to be spaced apart from each other. Also, the gate terminal 1053 of the driving TFT 1050 may be formed on the substrate 1002.

Thereafter, a first insulating layer 1021 covering the upper portion of the substrate 1002, the power wiring 1041, the ground wiring 1042, and the gate terminal 1053 may be formed.

A drain terminal 1051 and a source terminal 1052 of the driving TFT 1050 may be formed on the first insulating layer 1021. In particular, the source terminal 1052 can be formed after a partial region on the ground wire 1042 of the first insulating layer 1021 is etched, so that the source terminal 1052 and the ground wire 1042 may be electrically connected to each other.

Also, a partial region of the first insulating layer 1021 present on the power wiring 1041 may be etched, and a terminal electrically connected to the power wiring 1041 may be formed in the etched region.

Thereafter, a second insulating layer 1022 and a third insulating layer 1023 covering the first insulating layer 1021, the drain terminal 1051, and the source terminal 1052 may be formed. Each of the second insulating layer 1022 and the third insulating layer 1023 may be implemented with the same material as the first insulating layer 1021, or may be implemented with various known materials used for the insulating layer.

According to an embodiment, a gate terminal 1052 may be formed over a region between the drain terminal 1051 and the source terminal 1052 of the third insulating layer 1023. In this case, the gate terminal 1052 may not be formed on the substrate 1002.

On the other hand, some regions of the second insulating layer 1022 and the third insulating layer 1023 present on the power wiring 1041 and the ground wiring 1042 are etched, and a terminal electrically connected to the power wiring 1041 can be formed in the etched region and a terminal electrically connected to the source terminal 1052 may be formed.

Thereafter, a fourth insulating layer 1024 may be formed on the third insulating layer 1023. The fourth insulating layer 1024 may be made of the same material as at least one of the first insulating layer 1021 to the third insulating layer 1023, or a material used for the insulating layer.

A first assembly electrode 1011 and a second assembly electrode 1012 may be formed on the fourth insulating layer 1024. On the other hand, some regions of the fourth insulating layer 1024 present in the power wiring 1041 and the ground wiring 1042 are etched, and the first assembly electrode 1011 can be electrically connected to the power wiring 1041 through the etched region. The second assembly electrode 1012 may be formed to be electrically connected to the ground wiring 1042 through the etched region.

Thereafter, the fifth insulating layer 1025 and the partition wall 1030 may be formed on the fourth insulating layer 1024. In addition, a region in which the semiconductor light emitting device 1100 is to be assembled among the partition walls 1030 may be etched to form a coupling hole 1001.

The panel 1000 in which the coupling hole 1001 is formed is disposed on the chamber 1300 in which the fluid 1200 is accommodated, as shown in FIGS. 10 to 11, and the semiconductor light emitting device 1100 may be inserted into the coupling hole 1001 and assembled to the panel 1000. As described above, since the insulating layer 1025 is formed on the assembly electrodes 1011 and 1012, contact between the fluid 1200 and the assembly electrodes 1011 and 1012 may be prevented.

After the semiconductor light emitting device 1100 is assembled to the panel 1000, an electrode formation process of the semiconductor light emitting device 1100 may be performed. For example, a portion of the passivation layer 1170 and a portion of the second semiconductor layer 1130 of the semiconductor light emitting device 1100 can be etched to expose the first semiconductor layer 1110 and the second semiconductor layer 1130 to the outside. In addition, a first electrode 1112 may be formed on the exposed first semiconductor layer 1110, and a second electrode 1132 may be formed on the second semiconductor layer 1130.

After the electrode formation process is performed, a portion of the partition wall 1030 and the fifth insulating layer 1025 on the power wiring 1041 may be etched to form a first trench region (or a first contact 1063). A first wiring 1061 connecting the first assembly electrode 1011 exposed through the first trench region 1063 and the first electrode 1112 may be formed. The first wiring 1061 may be electrically connected to the wiring electrode 1041 as it is connected to the first assembly electrode 1011.

Further, a second trench region (or a second contact 1064) may be formed by etching a partial region of the partition wall 1030, the second insulating layer 1022 to the fifth insulating layer 1025 above the drain terminal 1051 of the driving TFT 1050. Thereafter, a second wiring 1064 connecting the drain terminal 1051 exposed through the second trench region 1064 and the second electrode 1132 may be formed.

In the case of the embodiment shown in FIG. 15, since the assembly electrodes 1011 and 1012 may be formed at the position closest to the semiconductor light emitting device 1100, an electric field can be more effectively applied to the semiconductor light emitting device 1100. Accordingly, the assembly rate of the semiconductor light emitting device 1100 may be maximized.

Meanwhile, according to the embodiment of FIG. 15, a plurality of etching processes could be needed to connect the assembly electrodes 1011 and 1012 to the power wiring 1041 and the ground wiring 1042.

Based on this, referring to FIG. 16, the assembly electrodes 1011 and 1012 may be formed on the third insulating layer 1023. In this case, since the number of etching processes for connecting the assembly electrodes 1011 and 1012 to the power wiring 1041 and the ground wiring 1042 can be reduced compared to FIG. 15, the process for forming the assembly electrode may be more efficient.

Also, referring to the embodiment of FIG. 17, the assembly electrodes 1011 and 1012 may be formed on the first insulating layer 1021. In this case, since an additional etching process for connecting the assembly electrodes 1011 and 1012 to the power wiring 1041 and the ground wiring 1042 is unnecessary, the process for forming the assembly electrode can be reduced compared to the embodiment of FIGS. 15 and 16 and can be more efficient. In particular, according to the embodiment of FIG. 17, since the second assembly electrode 1012 may be formed to extend from the source terminal 1052, the source terminal 1052 and the second assembly electrode 1012 can be formed in one process.

Also, referring to the embodiment of FIG. 18, the assembly electrodes 1011 and 1012 may be directly formed on the substrate 1002. In this case, as in the embodiment of FIG. 17, an etching process for connecting the assembly electrodes 1011 and 1012 to the power wiring 1041 and the ground wiring 1042 is unnecessary. In particular, according to the embodiment of FIG. 18, the first assembly electrode 1011 may be formed to extend from the power wiring 1041, and the second assembly electrode 1012 may be formed to extend from the ground wiring 1042. That is, the first assembly electrode 1011 and the power wiring 1041 can be formed in one process, and the second assembly electrode 1012 and the ground wiring 1042 can be formed in a single process such that forming process of assembly electrode can be done most efficiently.

The above description is merely illustrative of the technical idea of the present invention, and various modifications and variations are possible without departing from the essential characteristics of the present invention by those skilled in the art to which the present invention pertains.

Accordingly, the embodiments disclosed in the present invention are not intended to limit the technical spirit of the present invention, but to explain, and the scope of the technical spirit of the present invention is not limited by these embodiments.

The protection scope of the present invention should be interpreted by the following claims, and all technical ideas within the scope equivalent thereto should be construed as being included in the scope of the present invention.

The invention claimed is:

1. A display device comprising;
   a substrate;
   a power wiring and a ground wiring disposed on the substrate and spaced apart from each other;
   a driving thin film transistor (TFT) disposed on the substrate and having a source terminal electrically connected to the ground wiring;
   at least one insulating layer disposed on the substrate;
   a pair of assembly electrodes including a first assembly electrode and a second assembly electrode spaced apart from each other and disposed between the at least one insulating layer and the substrate;
   a semiconductor light emitting device including a first electrode and a second electrode, and assembled on the at least one insulating layer;
   a first wiring electrically connecting the first electrode of the semiconductor light emitting device, the first assembly electrode, and the power wiring;
   a second wiring electrically connecting the second electrode of the semiconductor light emitting device and a drain terminal of the driving TFT; and
   a partition wall including a first trench region on the at least one insulating layer, the partition wall further comprising a coupling hole that accommodates the semiconductor light emitting device,
   wherein the pair of assembly electrodes is configured to generate an electric field as a voltage is applied to any one of the pair of assembly electrodes,
   wherein the first wiring connects the first electrode and the first assembly electrode via the first trench region disposed in the partition wall,
   wherein the second assembly electrode separated from the second wiring,
   wherein an uppermost surface of the partition wall and an upper surface of the semiconductor light emitting device contacting the first wiring are coplanar, and
   wherein a bottommost surface of the partition wall and a bottommost surface of the semiconductor light emitting device are coplanar.

2. The display device of claim 1, wherein the second assembly electrode of the pair of assembly electrodes is electrically connected to the ground wiring.

3. The display device according to claim 2, wherein the pair of assembly electrodes are formed on the substrate, the first assembly electrode is formed to extend from the power wiring, and the second assembly electrode is formed to extend from the ground wiring.

4. The display device according to claim 2, wherein the at least one insulating layer comprises a first insulating layer covering the substrate, the power wiring, and the ground wiring,
   wherein the first assembly electrode, the second assembly electrode, and the source terminal are formed on the first insulating layer, wherein the first assembly electrode is electrically connected to the power wiring through an etching region formed on the power wiring of the first insulating layer, and wherein the second assembly electrode is formed to extend from the source terminal and is electrically connected to the ground wire through an etch region formed on the ground wire in the first insulating layer.

5. The display device according to claim 2, wherein the at least one insulating layer comprises:
a first insulating layer covering the substrate, the power wiring, and the ground wiring;
a second insulating layer covering the source terminal formed on the first insulating layer and covering the first insulating layer; and
a third insulating layer covering the first assembly electrode and the second assembly electrode formed on the second insulating layer, and the second insulating layer;
wherein the first assembly electrode is electrically connected to the power wiring through an etch region formed in each of the first insulating layer and the second insulating layer on the power wiring, and
wherein the second assembly electrode is electrically connected to the source terminal and the ground wire through an etch region formed in the second insulating layer on the ground wire.

6. The display device according to claim 2, wherein the at least one insulating layer comprises:
a first insulating layer covering the substrate, the power wiring, and the ground wiring;
a second insulating layer covering the source terminal formed on the first insulating layer and covering the first insulating layer; and
a third insulating layer on the second insulating layer, and wherein the first assembly electrode and the second assembly electrode are disposed on the third insulating layer.

7. The display device according to claim 2, wherein the at least one insulating layer comprises:
a first insulating layer covering the substrate, the power wiring, and the ground wiring;
a second insulating layer covering the source terminal formed on the first insulating layer and covering the first insulating layer; and
a third insulating layer on the second insulating layer, and wherein the first assembly electrode and the second assembly electrode are disposed on the first insulating layer.

8. The display device according to claim 7, wherein the second assembly electrode is extended from the source terminal, and the source terminal and the second assembly electrode are formed into one body.

9. The display device according to claim 2, wherein the at least one insulating layer comprises:
a first insulating layer covering the substrate, the power wiring, and the ground wiring;
a second insulating layer covering the source terminal formed on the first insulating layer and covering the first insulating layer; and
a third insulating layer on the second insulating layer, and wherein the first assembly electrode and the second assembly electrode are directly disposed on the substrate.

10. The display device according to claim 9, wherein the first assembly electrode is extended from the power wiring, and the first assembly electrode and the power wiring are formed into one body.

11. The display device according to claim 9, wherein the second assembly electrode is extended from the ground wiring, and the second assembly electrode and the ground wiring are formed into one body.

12. The display device according to claim 1, wherein the semiconductor light emitting device is positioned on the pair of assembly electrodes.

13. The display device according to claim 12, wherein the semiconductor light emitting device includes a magnetic layer having a magnetic material.

14. The display device according to claim 1, wherein the first wiring is electrically connected to the power wiring through the partition wall on the power wiring and the first trench region provided by etching the at least one insulating layer, and
wherein the second wiring is electrically connected to the drain terminal through the partition wall on the drain terminal and a second trench region provided by etching the at least one insulating layer.

15. The display device according to claim 1, wherein each of the first wiring and the second wiring is implemented as a transparent electrode.

16. The display device according to claim 1, wherein a spaced distance between the first assembly electrode and the second assembly electrode is less than a lateral width of the semiconductor light emitting device.

17. The display device according to claim 1, wherein the partition wall includes a second trench region exposing the drain terminal of the driving TFT to connect the second electrode and the drain terminal of the driving TFT.

18. A display device comprising;
a power wiring and a ground wiring disposed on a substrate and spaced apart from each other;
a driving thin film transistor (TFT) disposed on the substrate and having a source terminal electrically connected to the ground wiring;
at least one insulating layer disposed on the substrate;
a light emitting device including a first electrode and a second electrode on the substrate;
a pair of assembly electrodes disposed between the at least one insulating layer and the substrate, and including a first assembly electrode and a second assembly electrode spaced apart from each other;
a first wiring electrically connecting the first electrode of the light emitting device, the first assembly electrode, and the power wiring;
a second wiring electrically connecting the second electrode of the light emitting device and a drain terminal of the driving TFT; and
a partition wall including a first trench region on the at least one insulating layer, the partition wall further comprising a coupling hole that accommodates the light emitting device,
wherein the light emitting device is separated from the pair of assembly electrodes by the at least one insulating layer,
wherein the pair of assembly electrodes is configured to generate an electric field as a voltage is applied to any one of the pair of assembly electrodes,
wherein the first wiring connects the first electrode and the first assembly electrode via the first trench region disposed in the partition wall,
wherein the second assembly electrode is separated from the second wiring,
wherein an uppermost surface of the partition wall and an upper surface of the light emitting device contacting the first wiring are coplanar, and wherein a bottommost surface of the partition wall and a bottommost surface of the semiconductor light emitting device are coplanar.

19. The display device according to claim 18, wherein the at least one insulating layer is interposed between the driving TFT and the light emitting device.

20. The display device according to claim 18, wherein the first wiring and the second wiring penetrate through the at least one insulating layer.

21. The display device according to claim 18, wherein both the first assembly electrode and the second assembly electrode are vertically overlapped with the first electrode of the light emitting device.

22. A display device comprising;
   a substrate;
   a power wiring disposed on the substrate;
   at least one insulating layer disposed on the substrate;
   a pair of assembly electrodes including a first assembly electrode and a second assembly electrode spaced apart from each other and disposed between the at least one insulating layer and the substrate;
   a semiconductor light emitting device including an electrode assembled on the at least one insulating layer;
   a wiring electrically connecting the electrode of the semiconductor light emitting device, the first assembly electrode, and the power wiring; and
   a partition wall including a trench hole on the at least one insulating layer, the partition wall further comprising a coupling hole that accommodates the semiconductor light emitting device,
   wherein the pair of assembly electrodes is configured to generate an electric field as a voltage is applied to any one of the pair of assembly electrodes,
wherein the wiring connects the electrode, the first assembly electrode, and the power wiring via the trench hole disposed in the partition wall,
   wherein an uppermost surface of the partition wall and an upper surface of the semiconductor light emitting device contacting the wiring are coplanar, and
wherein a bottommost surface of the partition wall and a bottommost surface of the semiconductor light emitting device are coplanar.

* * * * *